United States Patent [19]

Russo

[11] Patent Number: 4,956,603
[45] Date of Patent: Sep. 11, 1990

[54] METHOD AND APPARATUS FOR MEASURING THE LIFETIME ON P-N SEMICONDUCTOR JUNCTIONS BY PHOTOVOLTAIC EFFECT

[75] Inventor: Vincenzo Russo, Acireale, Italy

[73] Assignee: SGS-Thomson Microelectronics S.r.L., Italy

[21] Appl. No.: 330,165

[22] Filed: Mar. 29, 1989

[30] Foreign Application Priority Data

Mar. 29, 1988 [IT] Italy .................. 20006 A/88

[51] Int. Cl.⁵ .................................. G01R 31/26
[52] U.S. Cl. ...................... 324/158 D; 324/158 T
[58] Field of Search .......... 324/158 D, 158 T, 158 R; 356/237; 250/492.2

[56] References Cited

U.S. PATENT DOCUMENTS

| | | | |
|---|---|---|---|
| 3,206,674 | 9/1965 | Thuy et al. | 324/158 D |
| 3,745,454 | 7/1973 | Nikirk et al. | 324/158 D |
| 4,211,488 | 7/1980 | Kleinknecht. | |
| 4,578,641 | 3/1986 | Tiedje | 324/158 D |
| 4,581,578 | 4/1986 | Honma et al. | 324/158 D |
| 4,713,819 | 12/1927 | Yoshikawa. | |

FOREIGN PATENT DOCUMENTS 3617588 12/1986 Fed. Rep. of Germany.

Primary Examiner—Ernest F. Karlsen
Attorney, Agent, or Firm—Birch, Stewart, Kolasch & Birch

[57] ABSTRACT

A method for measuring the lifetime of P.N. semiconductor junctions which includes subjecting one side of the junction to monochromatic radiation of a pre-established intensity and measuring the voltage Vp generated by the photovoltaic effect at the ends of the junction in order to calculate the lifetime $\tau$ because of a correlation between $\tau$ and Vp which can be expressed by means of a function $\tau(Vp)$ that takes into account the data relating to the measuring conditions and the structural parameters of the junction.

7 Claims, 2 Drawing Sheets

METHOD AND APPARATUS FOR MEASURING THE LIFETIME ON P-N SEMICONDUCTOR JUNCTIONS BY PHOTOVOLTAIC EFFECT

The present invention concerns a method and an apparatus for measuring the lifetime, by use of the photovoltaic effect, of semiconductor junctions. When manufacturing semiconductor devices (diodes, transistors, etc.) it is necessary to measure certain parameters of the devices. One of the most important of these parameters is the lifetime or mean life of electrons and holes. The relative measuring method should adequately meet the following requisites.

it should enable the measuring to be carried out not only on the finished device (chip or encapsulated chip) but also during the preceding manufacturing phases.

it should be as simple as possible so that the measurement can also be carried out by non-technical personnel;

it should be rapid so as to hold up the production process as little as possible;

it should enable non destructive measurements to be carried out directly on the wafers being manufactured with no additional processes making it impossible to re-use the wafer on which the measurement has been made;

it should be reliable, i.e. it should depend as little as possible on factors extraneous to the lifetime of the epitaxial layer and which are difficult to control (such as, for example, the lifetime of the substrate and the superficial recombinations).

There are different methods for measuring the lifetime, none of which fully satisfies the above requirements. In fact the methods either can only be used when the device has been completed (methods of the diode recovery type) or require troublesome preparation (methods based on the recovery time of a MOS capacitor), or are influenced by superficial effects (such as PEM-Photo Electro Magnetic effect methods), or again, are influenced by the lifetime of the substrate (such as methods of the SPV-Surface Photo Voltage type).

As far as the PEM method is concerned it is necessary to add that it cannot be applied to P-N junctions and requires extremely complex equipment that is not suitable for use during production. With regard to the SPV method it should be added that in practice it can be used only with measurement specimens thicker than 400 μm and it is therefore impossible to use it with epitaxial layers (which have a maximum thickness of approximately 200 μm).

The method of measurement permitted by the equipment according to the invention offers at least one of the following advantages:

it is simple and quick and therefore particularly suitable for use during production;

it is non-destructive and can therefore be used on wafers that are being manufactured;

it is not influenced by superficial recombinations;

the lifetime measurement limits are reduced to a few tens of microseconds for epitaxial wafers, while for diffused wafers (with superficial doping much higher than the doping of the other regions or "bulk" regions) there are no real limits at all.

According to the invention this is achieved by means of the method and/or equipment described in the claims hereunder.

The characteristics of the invention will be made clearer by the following description and by the drawings attached which refer to examples of a non-restrictive nature. In the drawings.

Figure 1:
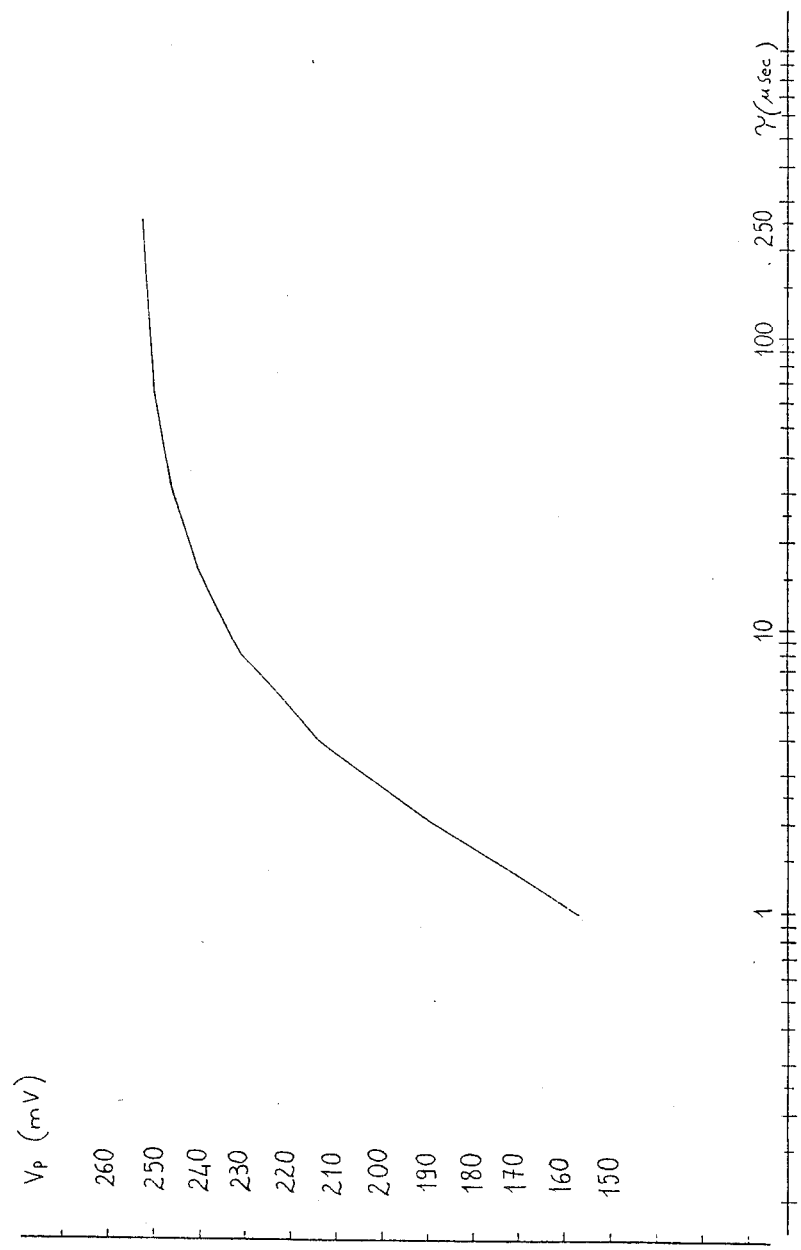
FIG. 1 shows an example of a curve Vp ($\tau$) obtained by means of the method according to the invention.

The method according to the invention applies to the P-N junctions. It was discovered that by subjecting a wafer to monochromatic radiation of pre-established intensity, the voltage that is generated at the terminals of the junction between the two surfaces of the wafer (and which hereunder is simply called "photovoltage") is related with close approximation to the lifetime, as well as to the measurement conditions and the structural parameters of the junction. In particular, for a P-N junction where the radiation strikes and penetrates the side P of the junction, it is possible to observe that:

$$Vp = f(\tau, Na, Nd, Xb, Xc, \alpha, I, G, Ri)$$

where
f is a well determined function of $\tau$, Na, etc.
Vp = photovoltage
$\tau = \sqrt{\tau_p \cdot \tau_n}$ = lifetime (where $\tau_n$ is the lifetime of the electrons and $\tau_p$ is the lifetime of the holes);
Na = doping of the zone P of the junction;
Nd = doping of zone N;
Xb = thickness of zone P;
Xc = thickness of zone N;
$\alpha$ = coefficient of light absorption in silicon (the value of which is a per se known function of the frequency F of the monochromatic radiation used);
I = intensity of monochromatic radiation;
G = radiation conversion efficiency;
Ri = reflectivity of the surface.

Being known the function "f" and the values of Na, Nb, Xb, Xc, a, I, G and Ri, which are the characteristics of a given batch of wafers to be measured, it is possible to establish a relationship between Vp and $\tau$ which can be expressed as a function of the type $\tau$ (Vp) or by the curve which represents it.

It is therefore clear that once the function f has been established, it is possible to program a microprocessor in a per se known way so that when data regarding the parameters Na, Nd, etc. is entered, it might compute the value of $\tau$ for each value of Vp.

According to the invention the function f can be defined by the following equation:

$$Vp = (2kT/q) \cdot \ln[(-B + \sqrt{B^2 + 4AC})/2A]$$

where:
k = Boltzmann's constant;
T = temperature of the wafer in Kelvin degrees;
q = electron charge;
$A = \{[v_p \cdot \sin h^2(Xc/Lp)]/[Nd \cdot \cos h(Xc/Lp)] + (v_n/Na) \cdot [\sin h^2(Xb/Ln) + r \cdot \cos h(Xb/Ln)]\} ni^2/[r + \cos h(Xb/Ln)]$
where:
$v_n = (Dn/Ln)/(\sin h(Xb/Lb)$
$v_p = (Dp/Lp)/(\sin h(Xc/Lp))$
r = a dimensionless parameter taking account of the incidence of the superficial layers; in the general case of a P+PNN+ structure with rapidly decreasing doping in the superficial zone P+ and basically constant doping in the regions P and N (diffused wafers), $r = \leq \leq 1$; in the particular case of a structure PNN+, i.e. with no superficial zone P+, such as, for example, a junction formed by the epitaxial growth of layers P and N on a highly doped substrate N+ (epitaxial wafers), $r = \geq \geq 1$; in both cases, therefore, the law of $\tau$'s dependence on Vp is independent of r;

$Lp = \sqrt{\tau \cdot Dp}$
$Ln = \sqrt{\tau \cdot Dn}$ where Dp and Dn are known doping functions (cf. for example R. S. Mueller—T. I. Kamins "Dispositivi elettronici nei circuiti integrati" (Electronic Devices in Integrated Circuits), published by Boringhieri, 1982, page 40);

$B = n_i \cdot W / \tau$ where
$n_i$ = number of carriers in the intrinsic silicon = $1.45 \cdot 10^{10}$ cm$^{-3}$
W = amplitude of junction depletion region = $\sqrt{2 \cdot \epsilon \cdot (\phi_i - V_p) \cdot [(1/Na) + (1/Nd)]/q}$
where
$\epsilon$ = dielectric constant of the silicon;
$\phi_i = (k \cdot T/q) \cdot \ln(Na \cdot Nd / n_i^2)$ $C = Cp \cdot v_p \cdot [Qp(Xc)/\cos h(Xc/Lp) - Qp(0)] + + Cn \cdot v_n \cdot \{Qn(Xb) - Qn(0)/[(r + \cos h(Xb/Ln)]\}$ where
$Cp = \phi_p \cdot \tau / [1 - (\alpha \cdot Lp)^2]$
$Cn = \phi_n \cdot \tau / [1 - (\alpha \cdot Ln)^2]$
where $\phi_n = \alpha \cdot G \cdot I \cdot (1 - Ri)$ and $\phi_p = \phi_n \cdot e^{-\alpha \times b}$ and where Qp(0), Qn(0), Qp(Xc), Qn(Xb) are obtained by means of the formulae $Qp(X) = \cos h(X/Lp) \cdot e^{-\alpha \times c} + \alpha \cdot Lp \cdot e^{-\alpha \times} \cdot \sin h(Xc/Lp) - \cos h[(Xc - X)/Lp]$ $Qn(X) = \cos h(X/Ln) \cdot e^{-\alpha \times c} + \alpha \cdot Ln \cdot e^{-\alpha \times} \cdot \sin h(Xb/Ln) - \cos h[(Xb - X)/Ln]$ with X=0 or X=Xb or X=Xc according to the particular case.

Figure 2:
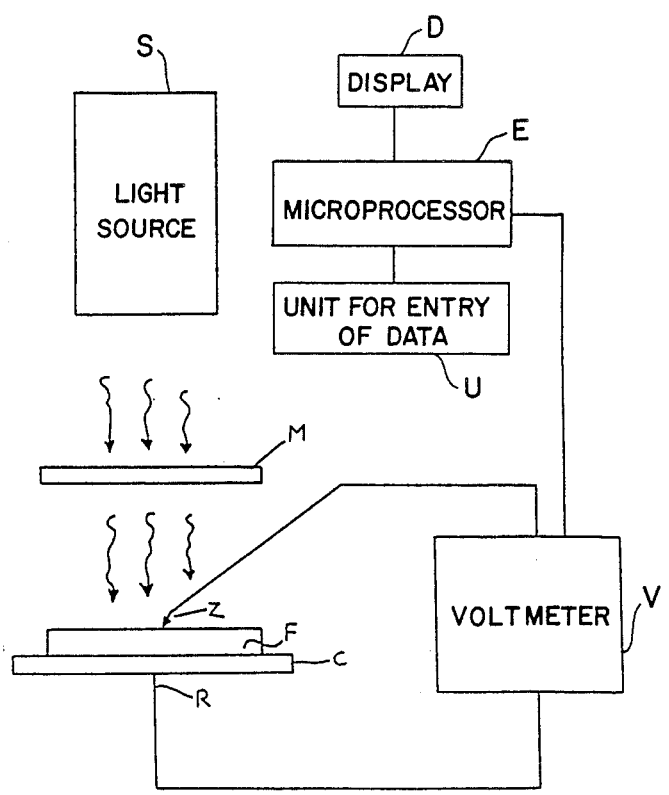
FIG. 2 is a block diagram of lifetime measuring equipment according to the invention.

In the case of radiation striking side N of the junction, the equations are similar to those given above and can be obtained from the above by replacing Dn with Dp, Xb with Xc and Na with Nd. As an example FIG. 1 shows the curve which, on the basis of the previous equations, establishes the relationship between $V_p$ and $\tau$ in the case of an epitaxial wafer ($r \leq \leq 1$), characterized by the following parameters relating to the measurement conditions and the particular structure of the junction:

$\alpha = 565$ cm$^{-1}$
Dn = 35 cm$^2 \cdot$sec$^{-1}$
Na = $25 \cdot 10^{13}$ cm$^{-3}$
Dp = 12 " "
Nd = $8 \cdot 10^{13}$ cm$^{-3}$
$\phi_n = 17.5 \cdot 10^{16}$ cm$^{-3}$
Xb = 40 $\mu$m
Xc = 90 $\mu$m FIG. 2 is a block diagram of an example of lifetime measuring equipment using the previously described method. The various parts are as follows:
S = adjustable brightness light source
M = monochromator
F = wafer
C = supporting chuck
V = voltmeter
E = microprocessor
U = unit for entry of data in microprocessor
D = display First the data regarding the measurement conditions ($\alpha$ and I) and the structural parameters of the junction (Na, Nd, Xb, Xc, Dn, Dp, G and Ri) are entered into the microprocessor E by means of U. When the monochromatic radiation emitted by M strikes the upper surface of the wafer, photovoltaic effect generates a voltage Vp between the upper and lower surfaces of the wafer (i.e. at the terminals of the P-N junction). Said voltage is picked up by the probe Z and by the second electrode R, connected to the supporting chuck, and sent to the voltmeter V. The measurement of Vp made by V is transformed into a digital signal which is sent from V to E. On the basis of said data and of the permanently memorized program in the microprocessor E (a program supplying the processor with the instructions necessary for calculating the value of $\tau$ from the value of Vp using the said function f and the data previously entered), the same microprocessor calculates the value of $\tau$ corresponding to Vp and displays it on D. The previously described measurement is a "punctual" measurement in the sense that it gives information regarding the lifetime of the zone immediately surrounding the point on the wafer where the probe rests. This makes it possible to detect any lack of uniformity of the lifetime on the wafer and thus reveal when the manufacturing process has failed to comply with the control specifications. When the method is used to control a process it is sufficient to verify that the $\tau$ of the wafers being produced does not fall outside a given range of set admissible values. In such a case a very approximate reading of the lifetime may be sufficient with the result that the monochromator may prove superfluous.

The method also enables measurements to be carried out on individual chips.

I claim:

1. A method for measuring the lifetime of P-N semiconductor junctions by means of the photovoltaic effect which comprises:
    subjecting a side of semiconductor junction to a monochromatic beam of light;
    measuring the photovoltage generated at the terminals of said junction as a result of the beam striking the side of the junction; and
    calculating the lifetime of said junction by means of a function $\tau$ (Vp) which is defined as follows:
    (a) in the case of light striking side P of the junction, by the following equations:

$V_p = (2kT/q) \cdot \ln\{(-B + \sqrt{B^2 + 4AC})/2A\}$ wherein,
$V_p$ = photovoltage;
k = Boltzmann's constant;
T = temperature of the wafer in degrees Kelvin;
q = charge of the electron;

$A = \{v_p \cdot \sin h^2(Xc/Lp)\}/Nd \cdot \cos h(Xc/Lp)\} + (V_n/Na) \cdot \{\sin h^2(Xb/Ln) + r \cdot \cos h(Xb/Ln)\}/\{r + \cos h(Xb/Ln)\} \cdot n_i^2$ wherein,
Xc = thickness of zone N of the junction;
Xb = thickness of zone P of the junction;
Na = doping of zone P of the junction;
Nd = doping of zone N of the junction;

$V_n = (Dn/Ln)/\{\sin h(Xb/Ln)\}$;
$V_p = (Dp/Lp)/\{\sin h(Xc/Lp)\}$;

$r$ = a dimensionless parameter which is much less than 1 in the general case of a P+PNN+ structure with rapidly decreasing doping in the superficial zone P+ and basically constant doping in the regions P and N, and much greater than 1 in the particular case of a structure PNN+, with no superficial zone P+;

$Lp = \sqrt{\tau \cdot Dp}$;
$Ln = \sqrt{\tau \cdot Dn}$;

wherein
$\tau$ = lifetime of semiconductor junction;
Dp and Dn = doping functions;

$B = n_i \cdot W/\tau$;

wherein,
$n_i$ = number of carriers in the intrinsic semiconductor material making up the wafer;
W = amplitude of junction depletion region = $\sqrt{2 \cdot \epsilon \cdot (\phi_i - V_p) \cdot \{(1/Na) + (1/Nd)\}/q}$;
wherein,
$\epsilon$ = dielectric constant of the intrinsic semiconductor material;
$\phi_i = (k \cdot T/q) \cdot \ln(Na \cdot Nd/n_i^2)$;

$C = Cp \cdot V_p \cdot \{Qp(Xc)/\cos h(Xc/Lp) - Qp(0)\} + Cn \cdot V_n \cdot \{Qn(Xb) - Qn(0)/\{(r + \cos h(Xb/Ln)\}\}$;

wherein,
$Cp = \phi_p \cdot \tau / \{1 - (\alpha \cdot Lp)^2\}$;
$Cn = \phi_n \cdot \tau / \{1 - (\alpha \cdot Ln)^2\}$;
wherein,
$\alpha$ = coefficient of absorption of light in the intrinsic semiconductor material;
$\phi_p = \alpha \cdot G \cdot I \cdot (1 - Ri)$ and $\phi_n = \phi_p \cdot e^{-\alpha \times b}$;
wherein I is the brightness of the beam of light and G and Ri (radiation conversion efficiency and surface reflectivity, respectively) are known functions of the data regarding the measurement conditions and the structural parameters of the junction;

and wherein Qp(0), Qn(0), Qp(Xc), Qn(Xb) are obtained by means of the formulae, $Qp(X) = \cos h(X/Lp) \cdot e^{-\alpha \times c} + \alpha \cdot Lp \cdot e^{-\alpha \times} \cdot \sin h(Xc/Lp) - \cos h\{(Xc - X)/Lp\}$;

$Qn(X) = \cos h(X/Ln) \cdot e^{-\alpha \times c} + \alpha \cdot Ln \cdot e^{-\alpha \times} \cdot \sin h(Xb/Ln) - \cos h\{(Xb - X)/Ln\}$;

with $X = 0$ or $X = Xb$ or $X = Xc$; and (b) in the case of light striking side N of the junction, by equations (a) described above, except replacing Dn with Dp, Xb with Xc and Na with Nd.

2. Apparatus for measuring the lifetime of P-N semiconductor junctions by means of the photovoltaic effect, whereby the lifetime of any zone of the junction is calculated from the measurement of the photovoltage generated at the terminals of the junction as a result of a beam of light striking one side of the junction, wherein said apparatus comprises a microprocessor programmed to calculate the lifetime of said junction based on the measurement of the photovoltage and on the basis of a function $\tau$ (Vp) which is defined as follows:

(a) in the case of light striking side P of the junction, by the following equations:

$V_p = (2kT/q) \cdot \ln\{(-B + \sqrt{B^2 + 4AC})/2A\}$ wherein,
$V_p$ = photovoltage;
$k$ = Boltzmann's constant;
T = temperature of the wafer in degrees Kelvin;
q = charge of the electron;

$A = \{v_p \cdot \sin h^2(Xc/Lp)\}/Nd \cdot \cos h(Xc/Lp)\} + (V_n/Na) \cdot \{\sin h^2(Xb/Ln) + r \cdot \cos h(Xb/Ln)\}/\{r + \cos h(Xb/Ln)\} \cdot n_i^2$ wherein,
Xc = thickness of zone N of the junction;
Xb = thickness of zone P of the junction;
Na = doping of zone P of the junction;
Nd = doping of zone N of the junction;
$V_n = (Dn/Ln)/\{\sin h(Xb/Ln)\}$;
$V_p = (Dp/Lp)/\{\sin h(Xc/Lp)\}$;
$r$ = a dimensionless parameter which is much less than 1 in the general case of a P+PNN+ structure with rapidly decreasing doping in the superficial zone P+ and basically constant doping in the regions P and N, and much greater than 1 in the particular case of a structure PNN+, with no superficial zone P+;

$Lp = \sqrt{\tau \cdot Dp}$;
$Ln = \sqrt{\tau \cdot Dn}$;
wherein $\tau$ = lifetime of semiconductor junction;
Dp and Dn = doping functions;

$B = n_i \cdot W/\tau$;

wherein,
$n_i$ = number of carriers in the intrinsic semiconductor material making up the wafer;
W = amplitude of junction depletion region = $\sqrt{2 \cdot \epsilon \cdot (\phi_i - V_p) \cdot \{(1/Na) + (1/Nd)\}/q}$;
wherein,
$\epsilon$ = dielectric constant of the intrinsic semiconductor material;
$\phi_i = (k \cdot T/q) \cdot \ln(Na \cdot Nd/n_i^2)$;

$C = Cp \cdot V_p \cdot \{Qp(Xc)/\cos h(Xc/Lp) - Qp(0)\} + Cn \cdot V_n \cdot \{Qn(Xb) - Qn(0)/\{(r + \cos h(Xb/Ln)\}\}$;

wherein,
$Cp = \phi_p \cdot \tau / \{1 - (\alpha \cdot Lp)^2\}$;
$Cn = \phi_n \cdot \tau / \{1 - (\alpha \cdot Ln)^2\}$;
wherein
$\alpha$ = coefficient of absorption of light in the intrinsic semiconductor material;
$\phi_p = \alpha \cdot G \cdot I \cdot (1 - Ri)$ and $\phi_p = \phi_n \cdot e^{-\alpha \times b}$; wherein I is the brightness of the beam of light and G and Ri (radiation conversion efficiency and surface reflectivity, respectively) are known functions of the data regarding the measurement conditions and the structural parameters of the junction;

and wherein Qp(0), Qn(0), Qp(Xc), Qn(Xb) are obtained by means of the formulae, $Qp(X) = \cos h(X/Lp) \cdot e^{-\alpha \times c} + \alpha \cdot Lp \cdot e^{-\alpha \times} \cdot \sin h(Xc/Lp) - \cos h\{(Xc - X)/Lp\}$;

$Qn(X) = \cos h(X/Ln) \cdot e^{-\alpha \times c} + \alpha \cdot Ln \cdot e^{-\alpha \times} \cdot \sin h(Xb/Ln) - \cos h\{(Xb - X)/Ln\}$;

with X=0 or X=Xb or X=Xc; and (b) in the case of light striking side N of the junction, by equations (a) described above, except replacing Dn with Dp, Xb with Xc and Na with Nd.

3. The method of claim 1, wherein said photovoltage is measured with a voltmeter which sends measurement data to a microprocessor which is programmed to calculate the lifetime of said junction based on said equations (a) and (b).

4. The apparatus of claim 2, wherein said apparatus further comprises a voltmeter for measuring the photovoltage of said semiconductor junction, and wherein said voltmeter sends measurement data to said microprocessor for calculating the lifetime of said junction.

5. The apparatus of claim 4, wherein said apparatus further comprises a light source for emitting a monochromatic beam of light, a support means for supporting said semiconductor junction, and a probe means and electrode for measuring photovoltage which are electrically connected to said semiconductor junction and to said voltmeter.

6. A method for measuring the lifetime of P-N semiconductor junctions by means of the photovoltaic effect which comprises:

subjecting a side of semiconductor junction to a monochromatic beam of light;

measuring the photovoltage generated at the terminals of said junction as a result of the beam striking a side of the semiconductor junction; and calculating the lifetime of said junction by means of a function $\tau$ (Vp) which takes into account the relationship between (1) the lifetime of the semiconductor conductor junction and (2) the generated photovoltage as well as the measurement conditions and the structural parameters of the junction.

7. The method of claim 6, wherein said photovoltage is measured with a voltmeter which sends measurement data a microprocessor which is programmed to calculate the lifetime of said junction based on said function $\tau$ (Vp).

* * * * *